US009806724B1

(12) United States Patent
Sharifzadeh et al.

(10) Patent No.: US 9,806,724 B1
(45) Date of Patent: Oct. 31, 2017

(54) SWITCHED-CAPACITOR CIRCUITS IN A PLL

(71) Applicant: QUALCOMM Incorporated, San Diego, CA (US)

(72) Inventors: Mojtaba Sharifzadeh, Mountain View, CA (US); Alireza Khalili, Sunnyvale, CA (US); Mazhareddin Taghivand, Campbell, CA (US); Mohammad Emadi, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/273,600

(22) Filed: Sep. 22, 2016

(51) Int. Cl.
*H03L 7/089* (2006.01)
*H03L 7/093* (2006.01)

(52) U.S. Cl.
CPC ............ *H03L 7/0891* (2013.01); *H03L 7/093* (2013.01)

(58) Field of Classification Search
CPC .............................. H03L 7/0891; H03L 7/093
USPC .................................. 327/156, 157, 158, 161
See application file for complete search history.

(56) References Cited

U.S. PATENT DOCUMENTS

| 7,202,717 | B2 | 4/2007 | Keaveney et al. |
| 7,629,854 | B2 | 12/2009 | Lin et al. |
| 8,525,564 | B2 | 9/2013 | Schober et al. |
| 9,024,684 | B2 | 5/2015 | Song et al. |
| 9,294,107 | B2 | 3/2016 | Suzuki |
| 2007/0188205 | A1* | 8/2007 | Chen ............... H03L 7/0896 327/157 |
| 2012/0139650 | A1* | 6/2012 | Tsai ............... H03D 13/00 331/1 R |

\* cited by examiner

*Primary Examiner* — John Poos
(74) *Attorney, Agent, or Firm* — Cobly Nipper/Qualcomm

(57) ABSTRACT

Various aspects of this disclosure describe switched-capacitor circuits in a PLL. Examples include routing current from a first current source through a capacitor to ground during a first clock phase, routing current from a second current source through the capacitor to ground during a second clock phase, and transferring charge on the capacitor to a loop filter capacitor during a third clock phase. The first current source may generate current responsive to UP error samples from a phase/frequency detector (PFD), and the second current source generates current responsive to DN error samples from the PFD.

27 Claims, 9 Drawing Sheets

600 ↘

```
┌─────────────────────────────────────────────┐
│ Route current from a first current source   │
│ through a capacitor to ground during a      │
│ first clock phase                           │
│                    602                      │
└─────────────────────────────────────────────┘
                      ↓
┌─────────────────────────────────────────────┐
│ Route current from a second current source  │
│ through the capacitor to ground during a    │
│ second clock phase                          │
│                    604                      │
└─────────────────────────────────────────────┘
                      ↓
┌─────────────────────────────────────────────┐
│ Transfer charge on the capacitor to a loop  │
│ filter capacitor during a third clock phase │
│                    606                      │
└─────────────────────────────────────────────┘
```

```
┌─────────────────────────────────────────────────────────────┐
│ Interleave a plurality of charge pump circuits over a       │
│ plurality of clock phases, each of the plurality of charge  │
│ pump circuits comprising a first current source, a second   │
│ current source, a capacitor, and a plurality of switches    │
│                          802                                │
└─────────────────────────────────────────────────────────────┘
                              │
                              ▼
┌─────────────────────────────────────────────────────────────┐
│ Route current with at least some of the plurality of        │
│ switches of each of the charge pump circuits from the first │
│ current source of each of the charge pump circuits through  │
│ the respective capacitor of each of the charge pump         │
│ circuits to ground during a first respective clock phase    │
│ for each of the charge pump circuits, the first respective  │
│ clock phase for each of the charge pump circuits            │
│ corresponding to a different one of the plurality of clock  │
│ phases                                                      │
│                          804                                │
└─────────────────────────────────────────────────────────────┘
                              │
                              ▼
┌─────────────────────────────────────────────────────────────┐
│ Route current with at least some of the plurality of        │
│ switches of each of the charge pump circuits from the       │
│ second current source of each of the charge pump circuits   │
│ through the respective capacitor of each of the charge pump │
│ circuits to ground during a second respective clock phase   │
│ for each of the charge pump circuits, the second respective │
│ clock phase for each of the charge pump circuits            │
│ corresponding to a different one of the plurality of clock  │
│ phases                                                      │
│                          806                                │
└─────────────────────────────────────────────────────────────┘
                              │
                              ▼
┌─────────────────────────────────────────────────────────────┐
│ Transfer charge on the respective capacitor of each of the  │
│ charge pump circuits to a loop filter capacitor with at     │
│ least some of the plurality of switches of each of the      │
│ charge pump circuits during a third respective clock phase  │
│ for each of the charge pump circuits, the third respective  │
│ clock phase for each of the charge pump circuits            │
│ corresponding to a different one of the plurality of clock  │
│ phases                                                      │
│                          808                                │
└─────────────────────────────────────────────────────────────┘
```

FIG. 8

SWITCHED-CAPACITOR CIRCUITS IN A PLL

BACKGROUND

Field of the Disclosure

The present disclosure relates to phase-locked loop (PLL) synthesizers.

Description of Related Art

Frequency synthesizers are workhorses of modern communication systems, providing stable clock signals in many aspects of a communication link, such as user devices, network devices, broadcast equipment, and the like. A phase-locked loop (PLL) is a common form of frequency synthesizer that can produce frequencies derived from a reference frequency provided to the PLL. Fractional PLL's are capable of synthesizing frequencies that are a fraction of the reference frequency input to the PLL, instead of only an integer multiple of the reference frequency.

In a fractional PLL, typically charge pump circuits are used to drive a loop filter, based on pulses from a phase/frequency detector that measures a phase, frequency, or phase and frequency difference between the reference signal and a feedback signal. Such charge pump circuits can introduce nonlinearities into a fractional PLL that cause noise to fold inside the PLL's bandwidth and an increase in spurs at the PLL's output. Nonlinearities are introduced by the charge pump circuits due to current mismatches in current sources comprising the charge pump circuits. For example, charge pump circuits may contain both P and N type current sources that are practically impossible to match, which inevitably introduces nonlinearities into the loop, thus degrading the quality of frequencies synthesized by the PLL. Quality can degrade significantly, making the frequencies synthesized by the PLL unusable in certain applications, such as applications that require low phase noise.

SUMMARY

This Summary is provided to introduce a selection of concepts in a simplified form that are further described below in the Detailed Description. This Summary is not intended to identify key features or essential features of the claimed subject matter.

In some aspects, a circuit transfers charge to a loop filter in a phase-locked loop (PLL). A first current source is connected to a first terminal of a first switch. A second current source is connected to a first terminal of a second switch. A capacitor has a first terminal connected to a second terminal of the first switch and a second terminal connected to a second terminal of the second switch. A third switch is connected from the first terminal of the capacitor to ground. A fourth switch is connected from the second terminal of the capacitor to ground. A fifth switch is connected from the second terminal of the capacitor to a loop filter capacitor.

In other aspects, a circuit for transferring charge to a loop filter in a phase-locked loop (PLL) comprises a first current source, a second current source, a capacitor, and a plurality of switches. The plurality of switches are configured to route current from the first current source through the capacitor to ground during a first clock phase. The plurality of switches are also configured to route current from the second current source through the capacitor to ground during a second clock phase. The plurality of switches are also configured to transfer charge on the capacitor to a loop filter capacitor during a third clock phase.

In still other aspects, a method of transferring charge to a loop filter in a phase-locked loop (PLL) routes current from a first current source through a capacitor to ground during a first clock phase. Current is routed from a second current source through the capacitor to ground during a second clock phase. Charge on the capacitor is transferred to a loop filter capacitor during a third clock phase.

In yet other aspects, a method for transferring charge to a loop filter in a phase-locked loop (PLL) interleaves a plurality of charge pump circuits over a plurality of clock phases. Each of the plurality of charge pump circuits comprises a first current source, a second current source, a capacitor, and a plurality of switches. Current is routed with at least some of the plurality of switches of a first charge pump circuit from the first current source of the first charge pump circuit through the respective capacitor of the first charge pump circuit to ground during at least one of the clock phases. Current is routed with at least some of the plurality of switches of a second charge pump circuit from the second current source of the second charge pump circuit through the respective capacitor of the second charge pump circuit to ground during the at least one of the clock phases. Charge on the respective capacitor of a third charge pump circuit is transferred to a loop filter capacitor with at least some of the plurality of switches of the third charge pump circuit during the at least one of the clock phases.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

BRIEF DESCRIPTION OF DRAWINGS

The detailed description references the accompanying figures. In the figures, the left-most digit(s) of a reference number identifies the figure in which the reference number first appears. The use of the same reference numbers in different instances in the description and the figures may indicate similar or identical items.

FIG. 6 illustrates an example method for generating charge in a charge pump and transferring the charge to a loop filter in accordance with one or more aspects.

FIG. 8 illustrates an example method for generating charge in a charge pump comprising interleaved, pipelined charge pumps and transferring the charge to a loop filter in accordance with one or more aspects.

DETAILED DESCRIPTION

Charge pump circuits are often used in a PLL to supply current to a loop filter. The loop filter integrates the current on a capacitor to set a control voltage on a voltage controlled oscillator (VCO), creating the PLL's output frequency. Control is provided by feedback, which is compared to a reference frequency in a phase/frequency detector (PFD), which generates error pulses to produce the current in the charge pump circuit.

Charge pump circuits can introduce nonlinearities into a PLL that cause noise to fold inside the PLL's bandwidth and an increase in spurs at the PLL's output. For example, nonlinearities can be introduced by the charge pump circuits due to current mismatches in current sources comprising the charge pump circuits. Current sources of different types are difficult to match and inevitably introduce nonlinearities into the loop through current mismatches.

In contrast, certain aspects described herein may include charge pump circuits that use current sources of a same type to charge a capacitor in the charge pump, and transfer the charge on the capacitor to a capacitor of the loop filter, thereby reducing nonlinearities introduced into the loop. The capacitor in the charge pump is effectively flipped on different clock phases by configuring switches at the different clock phases to route current through the capacitor from a first current source during a first clock phase, and from a second current source during the second clock phase. The first current source generates current responsive to one direction of pulse sampling from a phase/frequency detector (PFD), such as from UP error pulses, and the second current source generates current responsive the other direction of pulse sampling from the PFD, such as from DN error pulses. During a third clock phase, charge is transferred from the capacitor in the charge pump to a capacitor comprising the loop filter.

In the following discussion, an example system including a PLL with a charge pump and a loop filter is described. Techniques that elements of the example system may implement, and a device on which elements of the example system may be embodied, are also described. Consequently, performance of the example procedures is not limited to the example system and the example system is not limited to performance of the example procedures. Any reference made with respect to the example system, or elements thereof, is by way of example only and is not intended to limit any of the aspects described herein.

Figure 1:
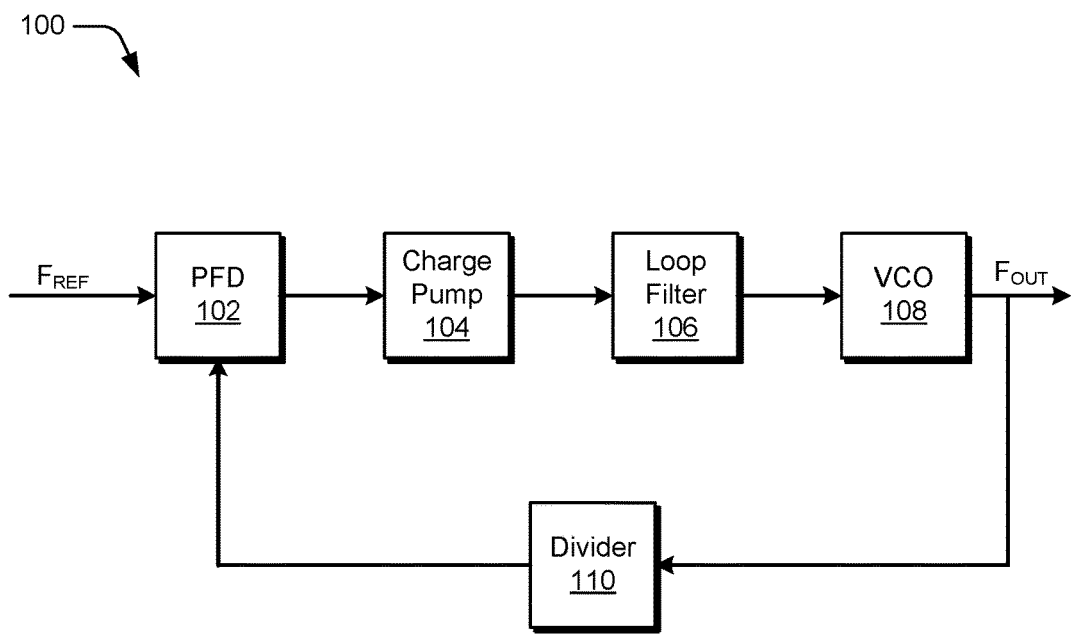
FIG. 1 illustrates an example phase-locked loop (PLL) synthesizer in accordance with one or more aspects.

FIG. 1 illustrates example PLL synthesizer 100 in accordance with one or more aspects of the disclosure. PLL synthesizer 100 may comprise any suitable type of device, such as a cellular phone, tablet, laptop computer, set-top box, satellite transceiver, cable television receiver, access point, desktop computer, gaming device, vehicle navigation system, cell tower, base station, cable head-end, and the like. Furthermore, PLL synthesizer 100 may comprise any suitable type of implementation, such as an application-specific integrated circuit (ASIC), multiple die on multiple chips, multiple die on a single chip, a System-on-Chip (SoC), discrete components, combinations thereof, and the like.

PLL synthesizer 100 includes phase/frequency detector (PFD) 102, charge pump 104, loop filter 106, and divider 110. For simplicity's sake, the discussion of PLL synthesizer 100 is reserved to these modules. However, various embodiments can include additional components, hardware, software and/or firmware without departing from the scope of the subject matter described herein. For example, such components not shown in FIG. 1 may include, but are not limited to, control logic, direct-digital synthesizers, amplifiers, filters, oscillators, mixers, isolators, couplers, processors, and the like. PFD 102 compares reference signal $F_{REF}$ to a feedback signal that is output from divider 110, and produces an error signal based on phase, frequency, or phase and frequency difference, depending on the type of PFD used. For example, in embodiments PFD 102 produces an error signal comprising two logical signals, UP and DN (abbreviations for up and down, respectively), representing a phase difference between reference signal $F_{REF}$ and the feedback signal from divider 110. Logical error signals UP and DN are generated in PFD 102 by determining whether the reference signal $F_{REF}$ leads or lags the feedback signal from divider 110. In embodiments, when reference signal $F_{REF}$ leads (lags) the feedback signal, an UP (DN) pulse is generated. In other embodiments, the sense is reversed, so when reference signal $F_{REF}$ leads (lags) the feedback signal, a DN (UP) pulse is generated. The width of the pulse comprising the error signal generated in PFD 102 is proportional to the amount of measured difference.

Error signals UP and DN from PFD 102 are provided to charge pump 104, which produces current responsive to the error signals. The wider the pulse of the error signal, the more current produced in the charge pump. Current from charge pump 104 is converted to voltage in loop filter 106, which is used to set the control voltage on VCO 108, thereby determining the frequency and phase of output signal $F_{OUT}$. Divider 110 receives the output signal $F_{OUT}$ and divides it by a prescribed amount to produce the feedback signal provided to PFD 102. Thus, PLL synthesizer 100 comprises a closed-loop feedback control system that locks the phase, frequency, or phase and frequency of the feedback signal from divider 110 to the reference signal $F_{REF}$.

The prescribed amount of division used in divider 110 determines the output frequency $F_{OUT}$. For example, when divider 110 is programmed to divide by N, for some integer N, the output frequency is then $F_{OUT}=N \cdot F_{REF}$. In embodiments, PLL synthesizer 100 is a fractional PLL, capable of synthesizing frequencies that are rational, non-integer multiples of the reference frequency. In such cases, divider 110 may be programmed to divide by N/M (equivalently, multiply $F_{OUT}$ by M/N to form the feedback signal), so that the output frequency is then $$F_{OUT} = \frac{N}{M}.$$

$F_{REF}$ for integers N and M. Various dividers comprising a fractional PLL are contemplated to be within the scope of the disclosure, including by way of example and not limitation, multiplying $F_{OUT}$ by M/(N+1) to form the feedback signal, so that the output frequency is then $$F_{OUT} = \frac{N+1}{M}.$$

$F_{REF}$; dividing $F_{OUT}$ by N+δ to form the feedback signal, where N is an integer and δ represents a fractional component greater than or equal to zero, but less than one, so that the output frequency is then $F_{OUT}=(N+δ)·F_{REF}$, and the like. A sigma-delta modulator can be used in divider 110 to set a fractional value that is statistically, or on average, a prescribed amount, such as by varying a divisor according to a probability.

Because current from charge pump 104 is used to set the output frequency and phase of PLL synthesizer 100 (through the loop filter and VCO), nonlinearities introduced in generating the current in charge pump 104 can significantly affect the fidelity of output signal $F_{OUT}$ and degrade performance if current generation techniques are not optimized. Performance degradation can be exacerbated in fractional PLL's. For example, fractional PLL's can use statistical methods to generate UP and DN error signals in PFD 102 and divider ratios in divider 110, which exacerbate nonlinearities introduced from current generation in charge pump 104.

Having considered a discussion of example PLL synthesizer 100, consider now a discussion of example charge pump and loop filter circuitry.

Figure 2:
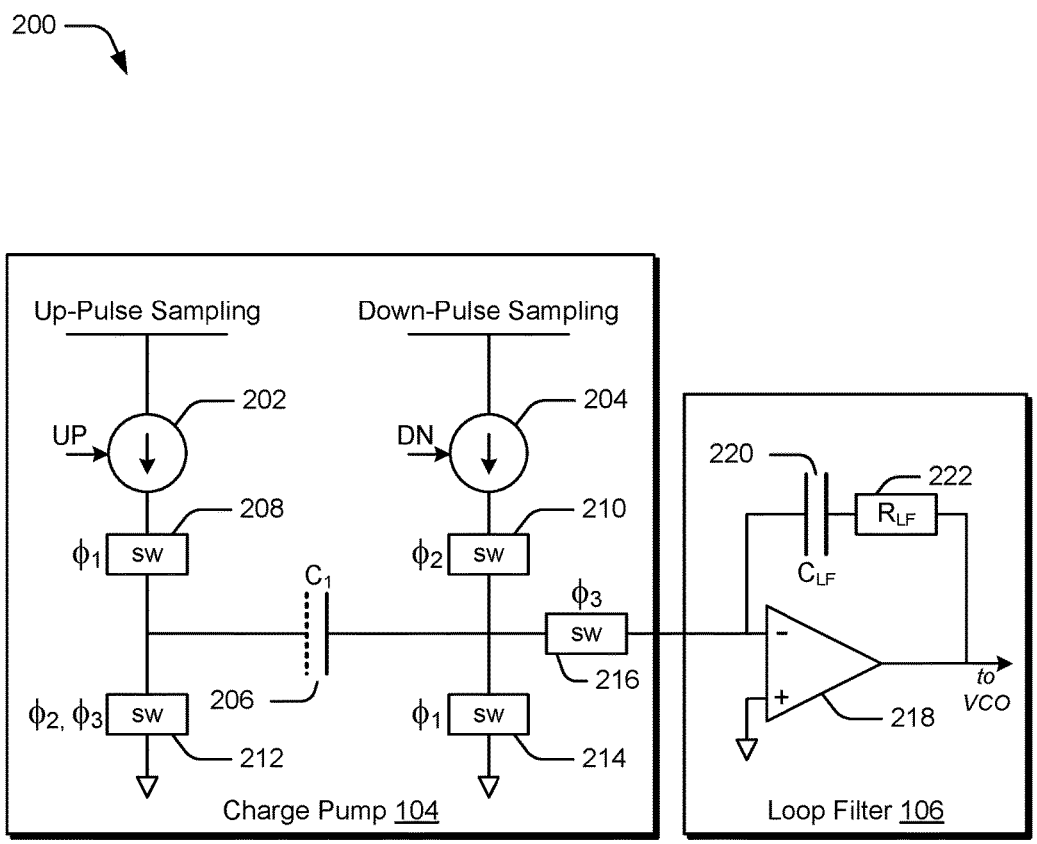
FIG. 2 illustrates example charge pump and loop filter circuitry in accordance with one or more aspects.

FIG. 2 illustrates example charge pump and loop filter circuitry 200 in accordance with one or more aspects of the disclosure. Charge pump and loop filter circuitry 200 include charge pump 104 and loop filter 106, which are substantially the same, or similar to, charge pump 104 and loop filter 106, respectively, in FIG. 1. Charge pump 104 comprises two current sources 202 and 204 connected to capacitor 206, denoted as C1, through a plurality of switches comprising switches 208 and 210. The plurality of switches also comprises switches 212, 214, and 216 to further configure and connect capacitor 206.

The output of charge pump 104 is connected to loop filter 106, comprising operational amplifier 218, capacitor 220, denoted as $C_{LF}$, and resistor 222, denoted as $R_{LF}$. Though loop filter 106 is illustrated in FIG. 2 as including operational amplifier 218 in a single-ended configuration with single capacitor and single resistor for simplicity, other loop filter configurations are contemplated, including, by way of example and not limitation, passive loop filters without operational amplifiers, differential loop filters, cascade of differential and single-ended configurations, loop filters with multiple capacitors, loop filters with multiple resistors, combinations thereof, and the like. Furthermore, values of loop filter capacitors and loop filter resistors can be programmable, so as to affect loop dynamics, such as loop bandwidth and dampening factor.

Current source 202 generates current responsive to UP error signal from PFD 102, and current source 204 generates current responsive to DN error signal from PFD 102. Switches 208, 210, 212, 214, and 216 are configurable to be opened or closed using control signals generated by control logic (not shown). Control signals are indicated proximate to the switches in FIG. 2. For example, control signal $ϕ_1$ proximate to switch 208 indicates that switch 208 is closed during a first clock phase. When closed, switch 208 connects current source 202 to a first terminal of capacitor 206 and to switch 212. Control signal $ϕ_1$ proximate to switch 208 also indicates that switch 208 is open for clock phases other than the first clock phase, such as a second clock phase and a third clock phase. Similarly, control signals $ϕ_1$ and $ϕ_3$ proximate to switch 212 indicate that switch 212 is closed during the first clock phase and the third clock phase, and open for the second clock phase. Other switches in FIG. 2 behave analogously, controlled by proximate control signals indicating switch position relative to clock phase.

In embodiments, during the first clock phase, switches 208 and 214 are closed, routing current from current source 202 through capacitor 206 to ground. Charge from current source 202, based on UP pulse samples from PFD 102, is therefore accumulated on capacitor 206 during the first clock phase. During the second clock phase, switches 210 and 212 are closed, routing current from current source 204 through capacitor 206 to ground. Charge from current source 204, based on DN pulse samples from PFD 102, is therefore accumulated on capacitor 206 during the second clock phase. During a third clock phase, switches 212 and 216 are closed, allowing charge on capacitor 206 that has accumulated during first and second clock phases to be transferred to loop filter capacitor $C_{LF}$ 220. These configurations corresponding to the different clock phases are further discussed below with respect to FIG. 3.

In embodiments, current source 202 and current source 204 are of a same process type, such as P-type comprising PMOS transistors, or N-type comprising NMOS transistors. Since the two current sources comprising charge pump 104 are of a same process type, mismatches introduced by the current sources are greatly reduced compared to charge pump configurations that use current sources of different process types. For example, mismatch in current from UP and DOWN error signals due to PMOS and NMOS process variations is eliminated in charge pump 104. Furthermore, after transferring charge from capacitor 206 to loop filter capacitor 220 during the third clock phase, charge on capacitor 206 discharges. Discharging capacitor 206 allows the voltage at the charge pump output to drop to zero, or near zero, rather than stay at the control voltage of the VCO set at the loop filter output, like other charge pump configurations. As a result, mismatches across different control voltages, and therefore frequency output, are minimized.

In embodiments, a first clock phase is followed by a second clock phase, which is followed by a third clock phase, and the cycle repeats with another first clock phase following the third clock phase. Furthermore, the frequency of the first, second, and third clock phases can be set based on a sampling frequency used to generate UP and DN error pulses in PFD 102. For example, the frequency of the first and second clock phases can be set so that charge is accumulated on capacitor 206 for at least one UP or DN error pulse generated by PFD 102. The first, second, and third clock phases can be phases of a clock that is synchronous to a sampling clock used to generate UP and DN error pulses in PFD 102. The first, second, and third clock phases can instead be phases of a clock that is asynchronous to a sampling clock used to generate UP and DN error pulses in PFD 102.

Having considered a discussion of example charge pump and loop filter circuitry 200, consider now a discussion of example charge pump circuit configurations for different clock phases.

Figure 3:
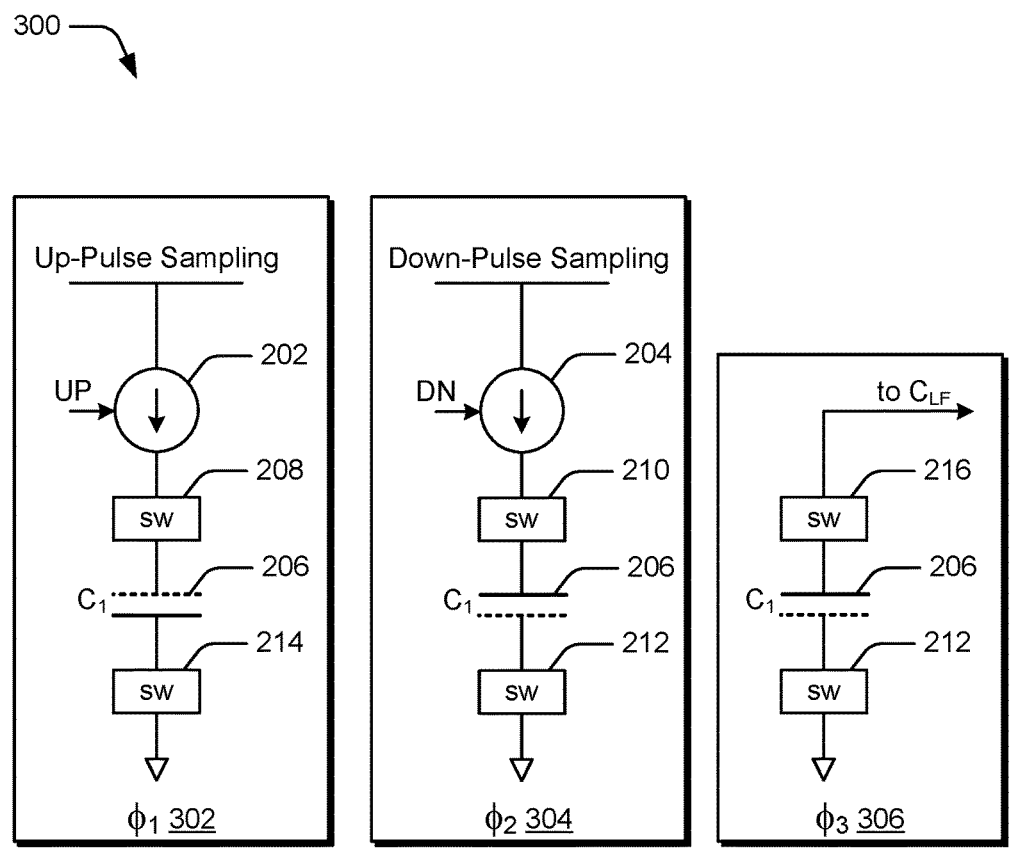
FIG. 3 illustrates example charge pump circuit configurations for different clock phases in accordance with one or more aspects.

FIG. 3 illustrates example charge pump circuit configurations for different clock phases 300 in accordance with one or more aspects of the disclosure. Charge pump circuit configurations for different clock phases 300 include configurations 302, 304, and 308. Configuration 302 illustrates circuit elements of charge pump 104 in FIG. 3 corresponding to the first clock phase; configuration 304 illustrates circuit elements of charge pump 104 in FIG. 3 corresponding to the second clock phase; and configuration 306 illustrates circuit elements of charge pump 104 in FIG. 3 corresponding to the third clock phase. For clarity, configurations 302, 304, and 308 include only those respective switches that are closed according to the respective clock phase; open switches are not illustrated.

During the first clock phase illustrated in configuration 302, charge from current source 202 is accumulated on capacitor 206 by routing current from current source 202 through capacitor 206 to ground, in a first direction by closing switches 208 and 214. During the second clock phase illustrated in configuration 304, charge from current source 204 is accumulated on capacitor 206 by routing current from current source 204 through capacitor 206 to ground, in a second direction by closing switches 210 and 212. Therefore, current generated from UP error pulses charges capacitor 206 in the first clock phase, and current using a same-type current source generated from DN error pulses charges capacitor 206 in the second clock phase.

Because current is routed through capacitor 206 in opposite directions in the first clock phase and the second clock phase, the capacitor is effectively flipped. To emphasize this idea, capacitor 206 is illustrated with one plate a solid line and another plate a dashed line in FIGS. 2 and 3. Observe that capacitor 206 is flipped between configurations 302 and 304.

During the third clock phase illustrated in configuration 306, charge accumulated on capacitor 206 during the first clock phase and the second clock phase is transferred from capacitor 206 to loop filter capacitor 220, by closing switches 212 and 216. Hence, one terminal of capacitor 206 is grounded, and the other terminal of capacitor 206 is connected to the loop filter.

In embodiments, switches 208, 210, 212, 214, and 216, capacitor 206, and current sources 202 and 204 comprise a unit cell, and the charge pump comprises second and third unit cells. The unit cells are separated by one clock phase delay to realize an interleaved, pipelined configuration.

Having considered a discussion of example charge pump circuit configurations for different clock phases 300, consider now a discussion of example interleaved charge pump and loop filter circuitry.

Figure 4:
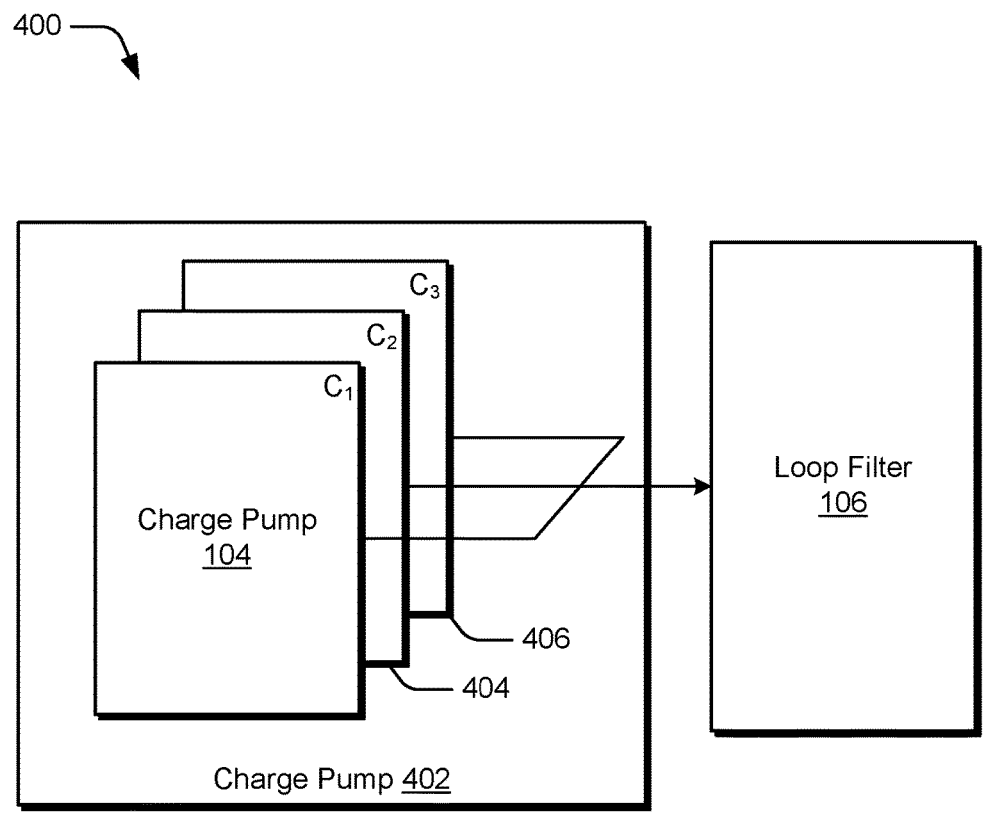
FIG. 4 illustrates example interleaved charge pump and loop filter circuitry in accordance with one or more aspects.

FIG. 4 illustrates example interleaved charge pump and loop filter circuitry 400 in accordance with one or more aspects of the disclosure. Interleaved charge pump and loop filter circuitry 400 comprises charge pump 402 and loop filter 106. Loop filter 106 is substantially the same, or similar to, loop filter 106 in FIG. 2. Charge pump 402 comprises charge pumps 104, 404, and 406. Charge pump 104 is substantially the same, or similar to, charge pump 104 in FIG. 2. Furthermore, charge pumps 404 and 406 are substantially the same, or similar to, charge pump 104 in FIG. 2. That is, charge pumps 104, 404, and 406 comprise a plurality of charge pumps each comprising a plurality of switches, a capacitor, and pair of current sources as illustrated in charge pump 104 in FIG. 2. In FIG. 4, to distinguish the respective capacitors of each of the charge pumps, charge pump 104 is indicated with a C1 designated in the top-right corner of charge pump 104, charge pump 404 is indicated with a C2 designated in the top-right corner of charge pump 404, and charge pump 406 is indicated with a C3 designated in the top-right corner of charge pump 404. Thus, charge pumps 104, 404, and 406 each respectively comprise capacitors C1, C2, and C3. In embodiments, capacitors C1, C2, and C3 are of a same nominal capacitance value. For example, capacitors C1, C2, and C3 can be selected, trimmed, or otherwise configured to be a particular nominal capacitance value, but due to device tolerances and other limitations, actual values of capacitance for capacitors C1, C2, and C3 may be within a threshold of the particular nominal capacitance value instead of the actual nominal capacitance value itself.

Furthermore, charge pumps 104, 404 and 406 comprise a plurality of charge pumps that are separated by a clock phase delay to form interleaved, pipelined charge pumps that are out of phase with respect to each other. For example, charge pumps 104 and 404 are separated by one clock phase delay, and charge pumps 404 and 406 are also separated by one clock phase delay. Therefore, at any one of the first clock phase, the second clock phase, and the third clock phase discussed with respect to FIG. 2 and FIG. 3, three charge pumps comprising charge pump 402 are operating in different configurations. A first of the charge pumps is routing current to its respective capacitor in a first direction from its respective first current source, a second of the charge pumps is routing current to its respective capacitor in a second direction from its respective second current source, and a third of the charge pumps is transferring charge from its respective capacitor to the loop filter capacitor comprising loop filter 106. Thus, the loop filter capacitor comprising loop filter 106 is transferred charge from a different one of capacitors C1, C2, and C3 at each of the first, second, and third clock phases. These operations are further described in FIG. 5 below.

UP and DN error pulses from PFD 102 can also be pipelined and passed between charge pumps 104, 404, and 406. Present UP and DN error pulses from PFD 102 can also be simultaneously passed to charge pumps 104, 404, and 406 instead of being pipelined between charge pumps.

Having considered a discussion of example charge pump circuit configurations for different clock phases, consider now a discussion of example charge pump circuit configurations for different clock phases for each of three interleaved charge pumps.

Figure 5:
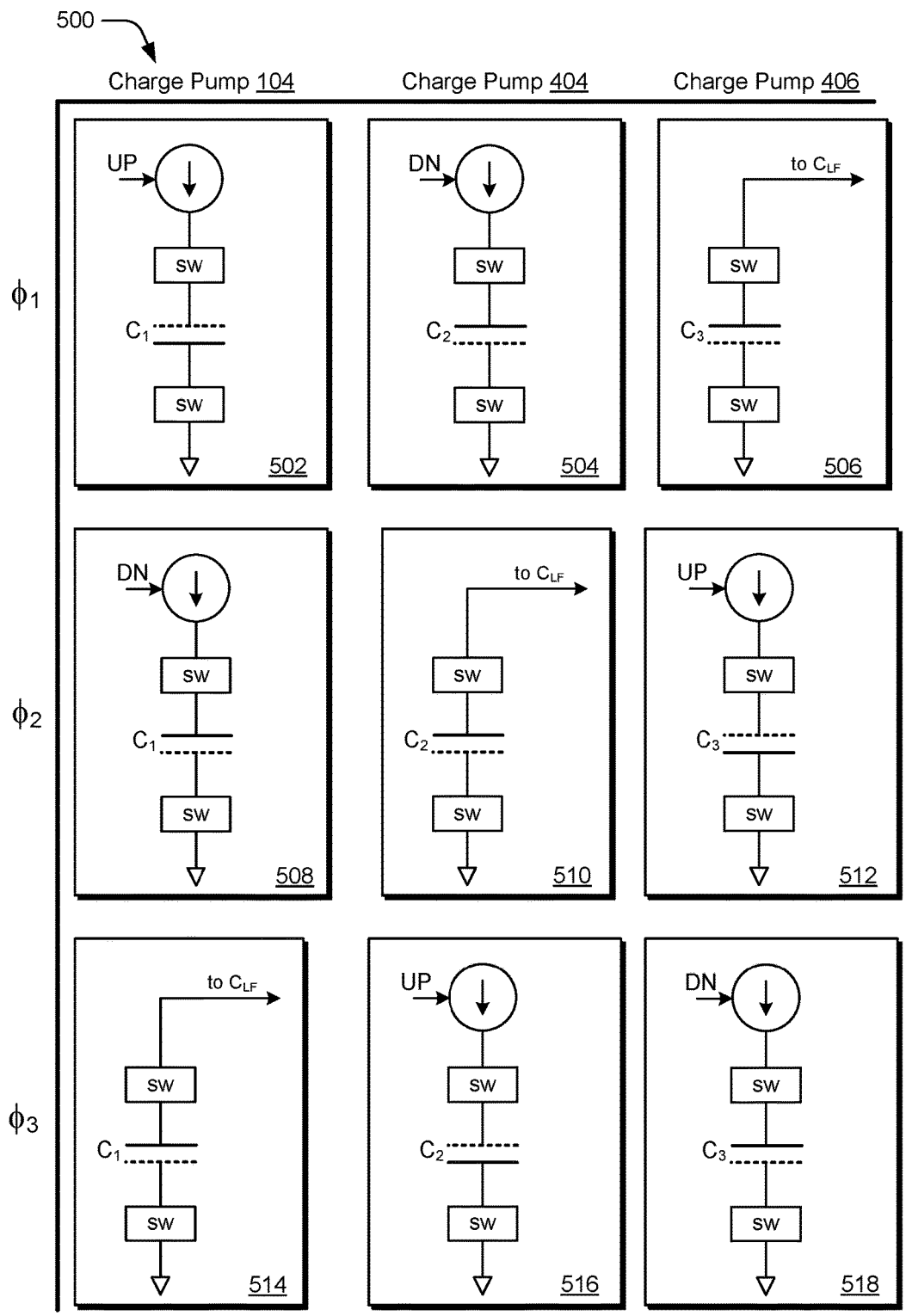
FIG. 5 illustrates example charge pump circuit configurations for different clock phases for each of three interleaved charge pumps in accordance with one or more aspects.

FIG. 5 illustrates example charge pump circuit configurations for different clock phases 500 in accordance with one or more aspects of the disclosure. Configurations for different clock phases 500 comprises a 3×3 array of configurations 502, 504, 506, 508, 510, 512, 514, 516, and 518. Rows of the array correspond to clock phases. For example, the first row of configurations (502, 504, and 506) corresponds to the first clock phase, the second row of configurations (508, 510, and 512) corresponds to the second clock phase, and the third row of configurations (514, 516, and 518) corresponds to the third clock phase. Similarly, columns of the array correspond to the three interleaved, pipelined charge pumps 104, 404, and 406 illustrated in FIG. 4. The first column of configurations (502, 508, and 514) corresponds to charge pump 104, the second column of configurations (504, 510, and 516) corresponds to charge pump 404, and the third column of configurations (506, 512, and 518) corresponds to charge pump 406.

Configurations 502, 504, 506, 508, 510, 512, 514, 516, and 518 comprise the 3×3 array and are illustrated using designators C1, C2, and C3 for the capacitors of charge pumps 104, 404, and 406, respectively. For clarity, switches in configurations 502, 504, 506, 508, 510, 512, 514, 516, and 518 are not designated. One skilled in the art would readily understand how to configure the switches comprising charge pumps 104, 404, and 406.

During the first clock phase, charge pump 104 is configured to route current generated from UP error pulses through C1 to ground in a first direction (configuration 502). Charge pump 404 is configured to route current generated from DN error pulses through C2 to ground in a second direction (configuration 504). Charge pump 406 is configured to transfer charge from C3 to the loop filter capacitor comprising loop filter 106 (configuration 506).

During the second clock phase, charge pump 104 is configured to route current generated from DN error pulses through C1 to ground in the second direction (configuration 508). Charge pump 404 is configured to transfer charge from C2 to the loop filter capacitor comprising loop filter 106 (configuration 510). Charge pump 406 is configured to route current generated from UP error pulses through C3 to ground in the first direction (configuration 512).

During the third clock phase, charge pump 104 is configured to transfer charge from C1 to the loop filter capacitor comprising loop filter 106 (configuration 514). Charge pump 404 is configured to route current generated from UP error pulses through C2 to ground in the first direction (configuration 516). Charge pump 406 is configured to route current generated from DN error pulses through C3 to ground in the second direction (configuration 518).

By interleaving three charge pump circuits in charge pump 402 as illustrated in FIG. 5, at any clock phase, one capacitor comprising charge pump 402 is being charged from current generated from UP error pulses, another capacitor included in charge pump 402 is being charged from current generated from DN error pulses, and charge from yet another capacitor in charge pump 402 is being transferred to the loop filter capacitor.

Having considered a discussion of example charge pump circuit configurations for different clock phases for each of three interleaved charge pumps, consider now a discussion of example methods for generating charge in a charge pump and transferring the charge to a loop filter.

FIG. 6 illustrates an example procedure 600 for generating charge in a charge pump and transferring the charge to a loop filter in accordance with one or more aspects of the disclosure. Aspects of the procedure may be implemented in hardware, firmware, software, or a combination thereof. The procedure is shown as a set of blocks that specify operations performed by one or more devices and are not necessarily limited to the orders shown for performing the operations by the respective blocks. In at least some embodiments the procedure may be performed by a suitably configured device or devices, such as a device or devices comprising the example PLL synthesizer 100, charge pump 104, and loop filter 106 described in FIGS. 1-5.

Current from a first current source is routed through a capacitor to ground during a first clock phase (block 602). For example, a plurality of switches is configured to route current through the capacitor to ground during the first clock phase, and the first current source generates current responsive to UP error pulses generated in a PFD. In embodiments, the plurality of switches used to route current from the first current source through the capacitor to ground comprises at least two switches configured to be closed.

Current from a second current source is routed through the capacitor to ground during a second clock phase (block 604). For example, a plurality of switches is configured to route current through the capacitor to ground during the second clock phase, and the second current source generates current responsive to DN error pulses generated in a PFD. In embodiments, the plurality of switches used to route current from the second current source through the capacitor to ground during the second clock phase comprises at least two switches configured to be closed. Current can be routed through the capacitor to ground during the second clock phase in a direction that is different than the direction in which current is routed through the capacitor to ground during the first clock phase. For example, by routing current through the capacitor to ground in opposite directions in the first and second clock phases, the capacitor is effectively flipped.

The first current source at block 602 and the second current source at block 604 can be of a same process type, such as P-type comprising PMOS transistors, or N-type comprising NMOS transistors.

Charge on the capacitor is transferred to a loop filter capacitor during a third clock phase (block 606). For example, a plurality of switches can be configured to ground one terminal of the capacitor while connecting the other terminal of the capacitor to a loop filter. The loop filter is configured to allow current from the accumulated charge on the capacitor to transfer charge to a capacitor comprising the loop filter. The loop filter capacitor is used, such as through a loop filter resistor, to set a control voltage for a VCO, thus setting an output frequency of the PLL.

A first clock phase can be followed by a second clock phase, which can be followed by a third clock phase, and the cycle can repeat with another first clock phase following the third clock phase. Therefore, the routing described at block 602, the routing described at block 604, and the transferring described at block 606 can be repeated for a plurality of first, second, and third clock phases.

Figure 7:
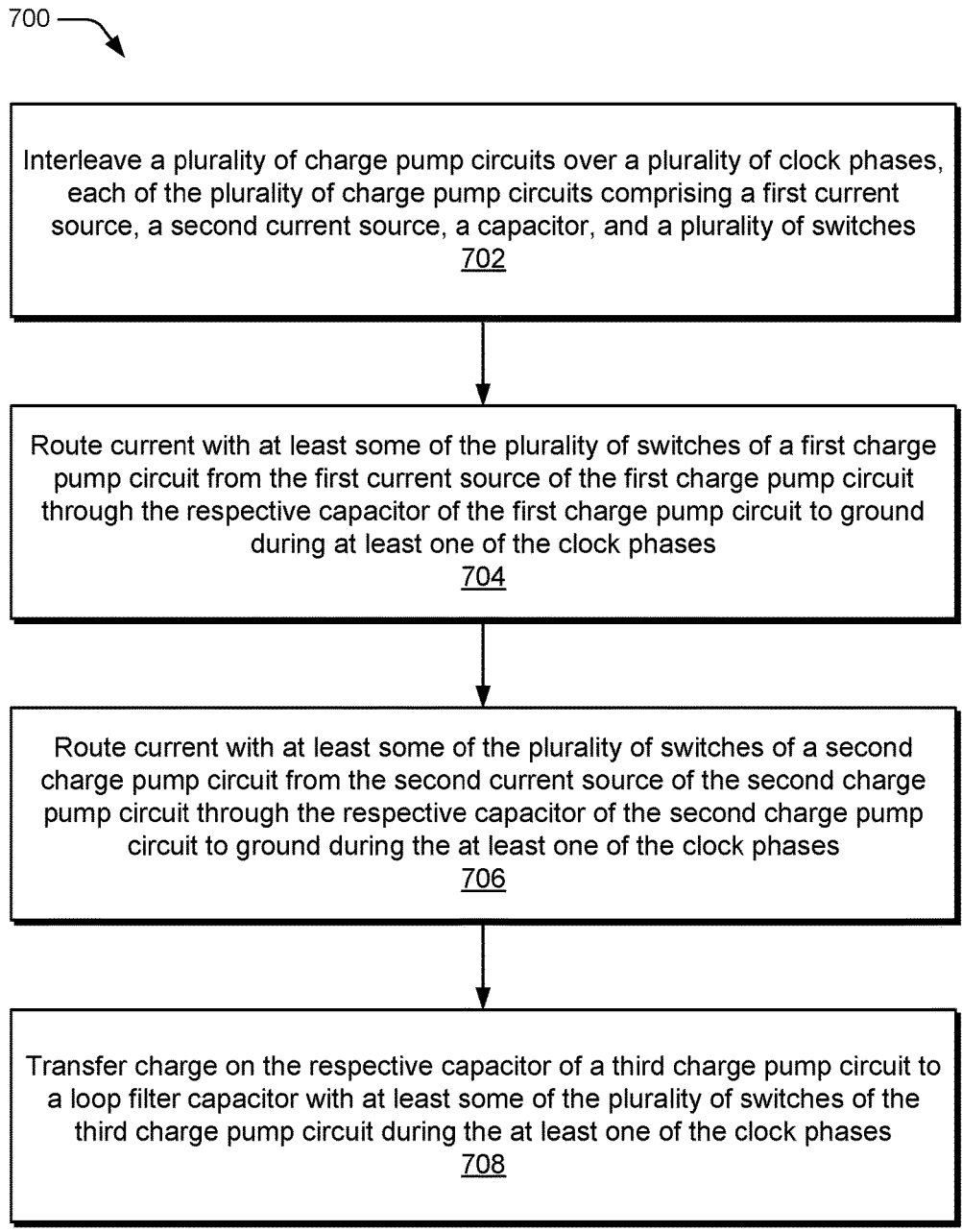
FIG. 7 illustrates an example method for generating charges in a charge pump comprising interleaved charge pumps and transferring the charges to a loop filter in accordance with one or more aspects.

FIG. 7 illustrates an example procedure 700 for generating charges in a charge pump comprising interleaved charge pumps and transferring the charges to a loop filter in accordance with one or more aspects of the disclosure. Aspects of the procedure may be implemented in hardware, firmware, software, or a combination thereof. The procedure is shown as a set of blocks that specify operations performed by one or more devices and are not necessarily limited to the orders shown for performing the operations by the respective blocks. In at least some embodiments the procedure may be performed by a suitably configured device or devices, such as a device or devices comprising the example charge pump 402 and loop filter 106 described in FIG. 4.

A plurality of charge pump circuits are interleaved over a plurality of clock phases (block 702). Each of the plurality of charge pump circuits comprises a first current source, a second current source, a capacitor, and a plurality of switches. For example, the plurality of charge pump circuits can comprise three charge pumps interleaved over three clock phases, as was previously described regarding FIG. 4. The plurality of charge pump circuits can be pipelined, with one clock phase delay separating neighboring charge pump circuits. Furthermore, the capacitors comprising each of the plurality of charge pump circuits can be of a same nominal capacitance value. For example, the capacitors for each of the plurality of charge pump circuits may be set to a same particular capacitance value, and the same particular capacitance value may be based on a capacitance value set for a loop filter capacitor, such as to optimize discharge time for transferring charge from the capacitor to the loop filter capacitor, not to exceed a percentage of the loop filter capacitor value, and the like.

In embodiments, the first current source and the second current source comprising a charge pump circuit are of a same process type, such as P-type comprising PMOS transistors, or N-type comprising NMOS transistors. Furthermore, each of the first current sources and each of the second current sources can be of a same process type, such as P-type comprising PMOS transistors, or N-type comprising NMOS transistors. Additionally, each of the first current sources can generate current responsive to up-pulse sampling using UP pulse samples from a PFD, and each of the second current sources can generate current responsive to down-pulse sampling using DN pulse samples from a PFD.

Current is routed with at least some of the plurality of switches of a first charge pump circuit from the first current source of the first charge pump circuit through the respective capacitor of the first charge pump circuit to ground during at least one of the clock phases (block 704). In embodiments, at least two switches comprising the plurality of switches of the first charge pump circuit are configured to be closed, and at least three switches comprising the plurality of switches of the first charge pump circuit are configured to be open to route the current from the first current source of the first charge pump circuit through the respective capacitor of the first charge pump circuit to ground. The first charge pump circuit can be the only charge pump circuit comprising the plurality of charge pump circuits that routes current from its respective first current source during the at least one of the clock phases.

Current is routed with at least some of the plurality of switches of a second charge pump circuit from the second current source of the second charge pump circuit through the respective capacitor of the second charge pump circuit to ground during the at least one of the clock phases (block 706). In embodiments, at least two switches comprising the plurality of switches of the second charge pump circuit are configured to be closed, and at least three switches comprising the plurality of switches of the second charge pump circuit are configured to be open to route the current from the second current source of the second charge pump circuit through the respective capacitor of the second charge pump circuit to ground. The second charge pump circuit can be the only charge pump circuit comprising the plurality of charge pump circuits that routes current from its respective second current source during the at least one of the clock phases.

Charge is transferred from the respective capacitor of a third charge pump circuit to a loop filter capacitor with at least some of the plurality of switches of the third charge pump circuit during the at least one of the clock phases (block 708). In embodiments, at least two switches comprising the plurality of switches of the third charge pump circuit are configured to be closed, and at least three switches comprising the plurality of switches of the third charge pump circuit are configured to be open to transfer the charge from the respective capacitor of the third charge pump circuit to the loop filter capacitor. The third charge pump circuit can be the only charge pump circuit comprising the plurality of charge pump circuits that transfers charge from its respective capacitor to the loop filter capacitor during the at least one of the clock phases.

FIG. 8 illustrates an example procedure 800 for generating charge in a charge pump comprising interleaved, pipelined charge pumps and transferring the charge to a loop filter in accordance with one or more aspects of the disclosure. Aspects of the procedure may be implemented in hardware, firmware, software, or a combination thereof. The procedure is shown as a set of blocks that specify operations performed by one or more devices and are not necessarily limited to the orders shown for performing the operations by the respective blocks. In at least some embodiments the procedure may be performed by a suitably configured device or devices, such as a device or devices comprising the example charge pump 402 and loop filter 106 described in FIG. 4.

A plurality of charge pump circuits are interleaved over a plurality of clock phases (block 802). Each of the plurality of charge pump circuits comprises a first current source, a second current source, a capacitor, and a plurality of switches. For example, the plurality of charge pump circuits can comprise three charge pumps interleaved over three clock phases, as was previously described regarding FIG. 4. In embodiments, the plurality of charge pump circuits are pipelined, with one clock phase delay separating neighboring charge pump circuits.

Current is routed with at least some of the plurality of switches of each of the charge pump circuits from the first current source of each of the charge pump circuits through the respective capacitor of each of the charge pump circuits to ground during a first respective clock phase for each of the charge pump circuits (block 804). The first respective clock phase for each of the charge pump circuits corresponds to a different one of the plurality of clock phases. Thus, the charge pump circuits are out of phase with respect to one another.

Current is routed with at least some of the plurality of switches of each of the charge pump circuits from the second current source of each of the charge pump circuits through the respective capacitor of each of the charge pump circuits to ground during a second respective clock phase for each of the charge pump circuits (block 806). The second respective clock phase for each of the charge pump circuits corresponds to a different one of the plurality of clock phases. Furthermore, the second respective clock phase for each of the charge pump circuits is different than the first respective clock phase for each of the charge pump circuits.

Charge on the respective capacitor of each of the charge pump circuits is transferred to a loop filter capacitor with at least some of the plurality of switches of each of the charge pump circuits during a third respective clock phase for each of the charge pump circuits (block 808). The third respective clock phase for each of the charge pump circuits corresponds to a different one of the plurality of clock phases. Furthermore, the third respective clock phase for each of the charge pump circuits is different than the first respective clock phase for each of the charge pump circuits and is different than the second respective clock phase for each of the charge pump circuits.

In embodiments, the plurality of clock phases consists of the first, the second, and the third clock phases, so that the first clock phase is followed by the second clock phase, which is followed by the third clock phase, and the cycle repeats with another first clock phase following the third clock phase. Thus, for any given clock phase, at least one of the plurality of charge pump circuits is charging its capacitor with current from its first current source generated responsive to UP error pulses, at least another of the plurality of charge pump circuits is charging its capacitor with current from its second current source generated responsive to DN error pulses, and yet at least another of the plurality of charge pump circuits is transferring charge from its capacitor to the loop filter capacitor. At a next clock phase, because the charge pump circuits are out of phase with respect to one another, the charge pump circuits are reconfigured by reconfiguring the plurality of switches and perform the operations that a neighboring charge pump performed on the previous clock phase. Hence, the same set of operations are performed (e.g., charging from a first current source, charging from a second current source, and transferring charge), at each clock phase, albeit with charge pumps configured differently than the previous clock phase.

Having considered a discussion of example methods for generating charge in a charge pump and transferring the charge to a loop filter, consider now a discussion of an example device having components through which aspects of reducing PLL nonlinearities using interleaved, pipelined switched-capacitor circuits can be implemented.

Figure 9:
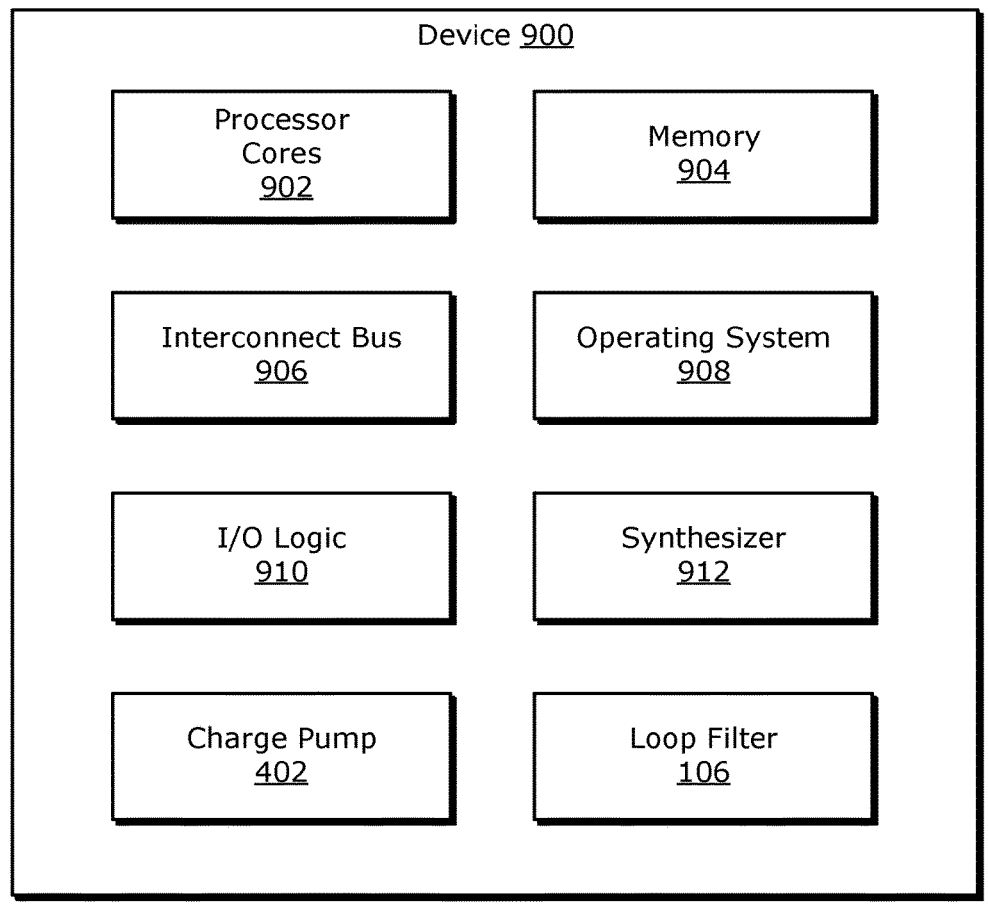
FIG. 9 illustrates a device having components through which aspects of reducing PLL nonlinearities using interleaved, pipelined switched-capacitor circuits can be implemented in accordance with one or more aspects.

FIG. 9 illustrates an example device 900, which includes components capable of implementing aspects of reducing PLL nonlinearities using interleaved, pipelined switched-capacitor circuits. Device 900 may be implemented as, or in, any suitable electronic device, such as a modem, broadband router, access point, cellular phone, smart-phone, gaming device, laptop computer, net book, set-top-box, smart-phone, network-attached storage (NAS) device, cell tower, satellite, cable head-end, and/or any other device that may use a PLL.

Device 900 may be integrated with a microprocessor, storage media, I/O logic, data interfaces, logic gates, a transmitter, a receiver, circuitry, firmware, software, and/or combinations thereof to provide communicative or processing functionalities. Device 900 may include a data bus (e.g., cross bar or interconnect fabric) enabling communication between the various components of the device. In some aspects, components of device 900 may interact via the data bus to implement aspects of reducing PLL nonlinearities using interleaved, pipelined switched-capacitor circuits.

In this particular example, device 900 includes processor cores 902 and memory 904. Memory 904 may include any suitable type of memory, such as volatile memory (e.g., DRAM), non-volatile memory (e.g., flash), cache, and the like. In the context of this disclosure, memory 904 is implemented as a storage medium, and does not include transitory propagating signals or carrier waves. Memory 904 can store data and processor-executable instructions of device 900, such as operating system 908 and other applications. Processor cores 902 may execute operating system 908 and other applications from memory 904 to implement functions of device 900, the data of which may be stored to memory 904 for future access. For example, processor cores may switch control functions to configure charge pump circuits. Device 900 may also include I/O logic 910, which can be configured to provide a variety of I/O ports or data interfaces for communication.

Device 900 also includes synthesizer 912. Synthesizer 912 may comprise components of a PLL synthesizer as illustrated in FIG. 1. For example, synthesizer 912 may include PFD 102, VCO 108, and divider 110.

Device 900 also includes charge pump 402. Charge pump 402 comprises at least one charge pump including a first current source, a second current source, a capacitor, and a plurality of switches as illustrated in FIG. 2. In embodiments, charge pump 402 comprises a plurality of interleaved, pipelined charge pumps, each of which comprises a first current source, a second current source, a capacitor, and a plurality of switches as illustrated in FIG. 4. A first current source generates current responsive to UP error pulses generated in a PFD, such as a PFD comprising synthesizer 912, and a second current source generates current responsive to DN error pulses generated in a PFD, such as a PFD comprising synthesizer 912.

Device 900 also includes loop filter 106, as illustrated in FIGS. 1 and 2. Loop filter 106 converts current from charge pump 402 to a VCO control voltage that is used set an output frequency of synthesizer 912. Loop filter 106 may be a passive filter, active filter, single ended, differential, comprise at least one capacitor, comprise at least one resistor, and combinations thereof.

In one or more exemplary embodiments, the functions described may be implemented in hardware, software, firmware, or any combination thereof. If implemented in software, functions may be stored on a computer-readable storage medium (CRM). In the context of this disclosure, a computer-readable storage medium may be any available medium that can be accessed by a general-purpose or special-purpose computer that does not include transitory propagating signals or carrier waves. By way of example, and not limitation, such media can comprise RAM, ROM, EEPROM, CD-ROM or other optical disk storage, magnetic disk storage, or other magnetic storage devices, or any other non-transitory medium that can be used to carry or store information that can be accessed by a general-purpose or special-purpose computer, or a general-purpose or special-purpose processor. The information can include any suitable type of data, such as computer-readable instructions, sampled signal values, data structures, program components, or other data. These examples, and any combination of storage media and/or memory devices, are intended to fit within the scope of non-transitory computer-readable media. Disk and disc, as used herein, includes compact disc (CD), laser disc, optical disc, digital versatile disc (DVD), floppy disk and Blu-ray disc where disks usually reproduce data magnetically, while discs reproduce data optically with a laser. Combinations of the above should also be included within the scope of computer-readable media.

Firmware components include electronic components with programmable memory configured to store executable instructions that direct the electronic component how to operate. In some cases, the executable instructions stored on the electronic component are permanent, while in other cases, the executable instructions can be updated and/or altered. At times, firmware components can be used in combination with hardware components and/or software components.

The term "component", "module", and "system" are indented to refer to one or more computer related entities, such as hardware, firmware, software, or any combination thereof, as further described above. At times, a component may refer to a process and/or thread of execution that is defined by processor-executable instructions. Alternately or additionally, a component may refer to various electronic and/or hardware entities.

Certain specific embodiments are described above for instructional purposes. The teachings of this disclosure have general applicability, however, and are not limited to the specific embodiments described above.

What is claimed is:

1. A circuit for transferring charge to a loop filter in a phase-locked loop (PLL), the circuit comprising:
   a first current source connected to a first terminal of a first switch;
   a second current source connected to a first terminal of a second switch;
   a first capacitor having a first terminal connected to a second terminal of the first switch and a second terminal connected to a second terminal of the second switch;
   a third switch connected from the first terminal of the first capacitor to ground;
   a fourth switch connected from the second terminal of the first capacitor to ground; and
   a fifth switch connected from the second terminal of the capacitor to a second capacitor in the loop filter in the PLL, the first switch and the fourth switch configured to be closed during a first clock phase, and the second switch, the third switch, and the fifth switch configured to be open during the first clock phase.

2. The circuit as recited in claim 1, wherein the second switch and the third switch are configured to be closed during a second clock phase, and the first switch, the fourth switch, and the fifth switch are configured to be open during the second clock phase.

3. The circuit as recited in claim 2, wherein the third switch and the fifth switch are configured to be closed during a third clock phase, and the first switch, the second switch, and the fourth switch are configured to be open during the third clock phase.

4. The circuit as recited in claim 3, wherein during the third clock phase, charge from the first capacitor is transferred to the second capacitor through the fifth switch.

5. The circuit as recited in claim 1, wherein the first current source provides current responsive to up-pulse sampling and the second current source provides current responsive to down-pulse sampling.

6. The circuit as recited in claim 1, wherein the first current source and the second current source are of a same process type.

7. A circuit for transferring charge to a loop filter in a phase-locked loop (PLL), the circuit comprising:
 a first current source connected to a first terminal of a first switch;
 a second current source connected to a first terminal of a second switch;
 a first capacitor having a first terminal connected to a second terminal of the first switch and a second terminal connected to a second terminal of the second switch;
 a third switch connected from the first terminal of the first capacitor to ground;
 a fourth switch connected from the second terminal of the first capacitor to ground; and
 a fifth switch connected from the second terminal of the capacitor to a second capacitor in the loop filter in the PLL, the first switch and the fourth switch configured to be closed during a first clock phase, and the second switch, the third switch, and the fifth switch configured to be open during the first clock phase,
 wherein the first current source, the second current source, the first switch, the second switch, the third switch, the fourth switch, the fifth switch, and the first capacitor comprise a unit cell, and the circuit further comprises a second unit cell and a third unit cell with a third capacitor and a fourth capacitor, respectively.

8. The circuit as recited in claim 7, wherein the unit cells are separated by one clock phase delay.

9. The circuit as recited in claim 7, wherein the capacitor, the third capacitor, and the fourth capacitor are of a same nominal capacitance value.

10. A charge pump in a phase-locked loop (PLL), the charge pump comprising:
 a first current source;
 a second current source;
 a capacitor; and
 a plurality of switches configured to:
  route current from the first current source through the capacitor to ground during a first clock phase;
  route current from the second current source through the capacitor to ground during a second clock phase; and
  transfer charge on the capacitor to a loop filter in the PLL during a third clock phase, the first clock phase, the second clock phase, and the third clock phase being different phases of a clock.

11. The charge pump as recited in claim 10, wherein the plurality of switches are configured to transfer charge on the capacitor to a capacitor in the PLL.

12. The charge pump as recited in claim 10, wherein the plurality of switches are further configured to:
 connect the first current source to a first terminal of the capacitor during the first clock phase; and
 connect the second current source to a second terminal of the capacitor during the second clock phase.

13. The charge pump as recited in claim 10, wherein the plurality of switches comprises:
 a first switch connected from the first current source to a first terminal of the capacitor;
 a second switch connected from the second current source to a second terminal of the capacitor;
 a third switch connected from the first terminal of the capacitor to ground;
 a fourth switch connected from the second terminal of the capacitor to ground; and
 a fifth switch connected from the second terminal of the capacitor to the loop filter.

14. The charge pump as recited in claim 10, wherein the first current source, the second current source, the plurality of switches, and the capacitor comprise a unit cell, and the charge pump further comprises a second unit cell and a third unit cell with a first additional capacitor and a second additional capacitor, respectively.

15. A device comprising:
 means for routing current from a first current source through a first capacitor to ground during a first clock phase;
 means for routing current from a second current source through the first capacitor to ground during a second clock phase; and
 means for transferring charge on the first capacitor to a second capacitor in a loop filter of a phase-locked loop (PLL) during a third clock phase, the first clock phase, the second clock phase, and the third clock phase being different phases of a clock.

16. The device as recited in claim 15, wherein the first current source and the second current source are of a same process type.

17. The device as recited in claim 15, further comprising means for configuring a plurality of switches on each of the first clock phase, the second clock phase, and the third clock phase.

18. The device as recited in claim 17, wherein the means for configuring the plurality of switches comprises:
 means for connecting the first current source to a first terminal of the capacitor during the first clock phase; and
 means for connecting the second current source to a second terminal of the capacitor during the second clock phase.

19. The device as recited in claim 17, wherein the means for configuring the plurality of switches comprises:
 means for connecting a first switch from the first current source to a first terminal of the first capacitor;
 means for connecting a second switch from the second current source to a second terminal of the first capacitor;
 means for connecting a third switch from the first terminal of the first capacitor to ground;
 means for connecting a fourth switch from the second terminal of the first capacitor to ground; and
 means for connecting a fifth switch from the second terminal of the first capacitor to the second capacitor.

20. The device as recited in claim 15, wherein the first current source, the second current source, the means for routing current from the first current source, the means for routing current from the second current source, the means for transferring charge, and the first capacitor comprise a unit cell, and the device further comprises a second unit cell and a third unit cell with a second capacitor and a third capacitor, respectively.

21. A method for transferring charge to a loop filter in a phase-locked loop (PLL), the method comprising:
    interleaving a plurality of charge pump circuits over a plurality of clock phases, each of the plurality of charge pump circuits comprising:
        a first current source;
        a second current source;
        a capacitor; and
        a plurality of switches;
    routing current with at least some of the plurality of switches of a first charge pump circuit of the plurality of charge pump circuits from the first current source of the first charge pump circuit through the respective capacitor of the first charge pump circuit to ground during at least one of the clock phases;
    routing current with at least some of the plurality of switches of a second charge pump circuit of the plurality of charge pump circuits from the second current source of the second charge pump circuit through the respective capacitor of the second charge pump circuit to ground during the at least one of the clock phases; and
    transferring charge on the respective capacitor of a third charge pump circuit of the plurality of charge pump circuits to the loop filter in the PLL with at least some of the plurality of switches of the third charge pump circuit during the at least one of the clock phases.

22. The method as recited in claim 21, wherein, for each of the plurality of charge pump circuits, the first current source and the second current source are of a same process type.

23. The method as recited in claim 21, wherein the capacitors of each of the plurality of charge pump circuits are of a same nominal capacitance value.

24. The method as recited in claim 21, wherein, for each of the plurality of charge pump circuits, the plurality of switches comprises:
    a first switch connected from the first current source to a first terminal of the capacitor;
    a second switch connected from the second current source to a second terminal of the capacitor;
    a third switch connected from the first terminal of the capacitor to ground;
    a fourth switch connected from the second terminal of the capacitor to ground; and
    a fifth switch connected from the second terminal of the capacitor to the capacitor comprising the loop filter.

25. The method as recited in claim 21, wherein the plurality of charge pump circuits are included in a System-on-Chip (SoC).

26. The method as recited in claim 21, further comprising for each of the plurality of charge pump circuits, providing current responsive to up-pulse sampling with the first current source during at least a first respective clock phase and providing current responsive to down-pulse sampling with the second current source during at least a second respective clock phase different than the first respective clock phase.

27. The method as recited in claim 26, further comprising for each of the plurality of charge pump circuits, transferring charge on the respective capacitor of the respective charge pump circuit to the capacitor comprising the loop filter during at least a third respective clock phase different from the second respective clock phase and different from the first respective clock phase.

* * * * *